US006938872B2

(12) United States Patent
Nygaard

(10) Patent No.: US 6,938,872 B2
(45) Date of Patent: Sep. 6, 2005

(54) MACHINE SHOE FOR THE SUPPORT OF MACHINES AND A METHOD

(75) Inventor: Knud Nygaard, Vodskov (DK)

(73) Assignee: NGI ApS, Norresundby (DK)

( * ) Notice: Subject to any disclaimer, the term of this patent is extended or adjusted under 35 U.S.C. 154(b) by 84 days.

(21) Appl. No.: 10/689,739

(22) Filed: Oct. 22, 2003

(65) Prior Publication Data

US 2004/0135057 A1 Jul. 15, 2004

Related U.S. Application Data

(60) Provisional application No. 60/440,330, filed on Jan. 16, 2003.

(30) Foreign Application Priority Data

Jan. 14, 2003 (DK) .......................................... 2003 00025

(51) Int. Cl.[7] .............................................. F16M 11/00
(52) U.S. Cl. .................................... 248/677; 248/188.8
(58) Field of Search .............................. 248/677, 188.8, 248/188.9, 637, 676, 649, 650, 673, 560, 561, 562, 580, 599, 632, 615; 138/162, 192

(56) References Cited

U.S. PATENT DOCUMENTS

| 4,575,034 A | * | 3/1986 | Tobey ...................... 248/188.9 |
| 6,138,979 A | * | 10/2000 | Morman ...................... 248/638 |
| 6,520,459 B2 | * | 2/2003 | Burr ......................... 248/188.4 |
| 6,742,750 B2 | * | 6/2004 | Burr ......................... 248/188.4 |
| 2001/0019096 A1 | * | 9/2001 | Andreoli et al. .......... 248/188.8 |
| 2002/0008187 A1 | * | 1/2002 | Ganter ........................ 248/677 |

FOREIGN PATENT DOCUMENTS

DK          9300256          8/1993

* cited by examiner

Primary Examiner—Ramon O Ramirez
(74) Attorney, Agent, or Firm—Dykema Gossett PLLC

(57) ABSTRACT

A machine shoe and a method for the support of objects, such as apparatuses and machines, characterized by being tolerant to irregularities in the surface on which the object to be supported is placed. The machine shoe has a movable spindle which is secured in concealed fashion in a base by insertion into two locking rings integrated in a polymer material of a lower part of the base. The centre point between the locking rings forms the centre for the movements of the spindle.

8 Claims, 4 Drawing Sheets

MACHINE SHOE FOR THE SUPPORT OF MACHINES AND A METHOD

This application claims the benefit of U.S. Provisional Appln. No. 60/440,330, filed Jan. 16, 2003.

BACKGROUND OF THE INVENTION

1. Field of the Invention

The invention relates to a machine shoe for the support of objects, such as apparatuses and machines, with a movable metallic spindle secured to a base consisting of a bottom made of polymer material, such as a rubber product, with a metallic upper part. The invention moreover relates to method of supporting objects, such as apparatuses and machines.

2. The Prior Art

Danish Utility Model DK 93 00256 discloses a machine shoe with a concealed attachment of the spindle, which is mounted on the object to be supported, in the lower base of the machine shoe.

In many applications where machine shoes are used, there are great requirements with respect to hygiene. This applied to, e.g., the food and hospital sectors.

The concealed attachment of the spindle and base part of the machine shoe is therefore of great importance to the hygiene, as the completely closed bottom prevents impurities and bacteria from penetrating up into the machine shoe from, e.g., a floor or tile level on which the machine shoe is placed.

The machine shoe as described in the Danish utility model, however, has the drawback that the spindle is secured to the base of the machine shoe in a manner which just permits a very small movement of the spindle relative to the lower part of the support. This means that requirements must be made with respect to the face on which the machine shoe is placed, as it must be almost plane and parallel with the bottom face of the machine shoe in order for the machine shoe to support with the entire bottom face.

Machine shoes are known where the spindle part can be moved better relative to the lower part of the machine shoe. One type of these is characterized in that the spindle stands on the lower part of the machine shoe without being secured to the bottom part. This, however, creates problems in situations where the object supported by the machine shoe is to be moved, since, in that case, the machine shoe parts fall apart. In other types, the spindle in a lower ball head is secured to the lower part of the machine shoe, but it is problematic for both types that impurities may accumulate in the joints of the machine shoe.

In other known machine shoe types, the spindle may also be moved relative to the lower part of the machine shoe, while the spindle is secured to the base of the machine shoe. These machine shoe types are characterized in that the spindle is secured to the base of the machine shoe by assembly through an opening in the bottom of the machine shoe, frequently by screwing a nut on the lower end of the spindle. These structures, however, have the drawback that, e.g., impurities and bacteria may accumulate in the hole in the bottom of the machine shoe, which per se constitutes a hygiene problem. Further, certain structures involve the risk that impurities and bacteria from the opening in the bottom of the machine shoe can penetrate up through the machine shoe and from there to the object which is to be supported.

Accordingly, an object of the invention is to improve the known machine shoe structure of the type where the spindle may be moved relative to the base, and so that accumulation of impurities is eliminated.

SUMMARY OF THE INVENTION

The object of the invention is achieved by a support apparatus having a movable spindle mounted to a base which is characterized in that the attachment of the spindle in the base is concealed, and that the surface of the base is shaped as part of a ball face.

Hereby, the bottom face of the machine shoe may remain uninterrupted, thereby preventing impurities and bacteria from accumulating in the machine shoe, thus eliminating the risk that impurities and bacteria from the bottom can penetrate up through the machine shape and spread to the object which is supported.

The, invention is moreover characterized in that at least two locking rings for the attachment of a spindle are integrated in the polymer part of the base. This provides the advantage that the relation ship between the force by which the spindle is attached to the base of the machine shoe and the volume of the base is optimized.

A further feature of the invention is that the locking rings integrated in the base are positioned in parallel and with the same centre axis, so that the centre point between the centre hole of the locking rings coincides with the centre of the movement of a spindle which is held by the locking rings, whereby the spindle may be moved optimally as it is attached at its pivot point.

The invention is also characterized in that the upper face of the base, in the direction from which a secured spindle extends, is shaped as part of a ball face with the centre in the centre point between the centre holes of the integrated locking rings, thereby ensuring that the spindle may be moved freely in all directions solely restricted by the ball face.

As mentioned, the invention also relates to a method which is characterized in that one or more components are used for the support, which allows optimum hygiene in supports based on machine shoes.

BRIEF DESCRIPTION OF THE DRAWINGS

The invention will now be explained more fully with reference to the drawings, in which.

DETAILED DESCRIPTION OF THE PREFERRED EMBODIMENT

Figure 1:
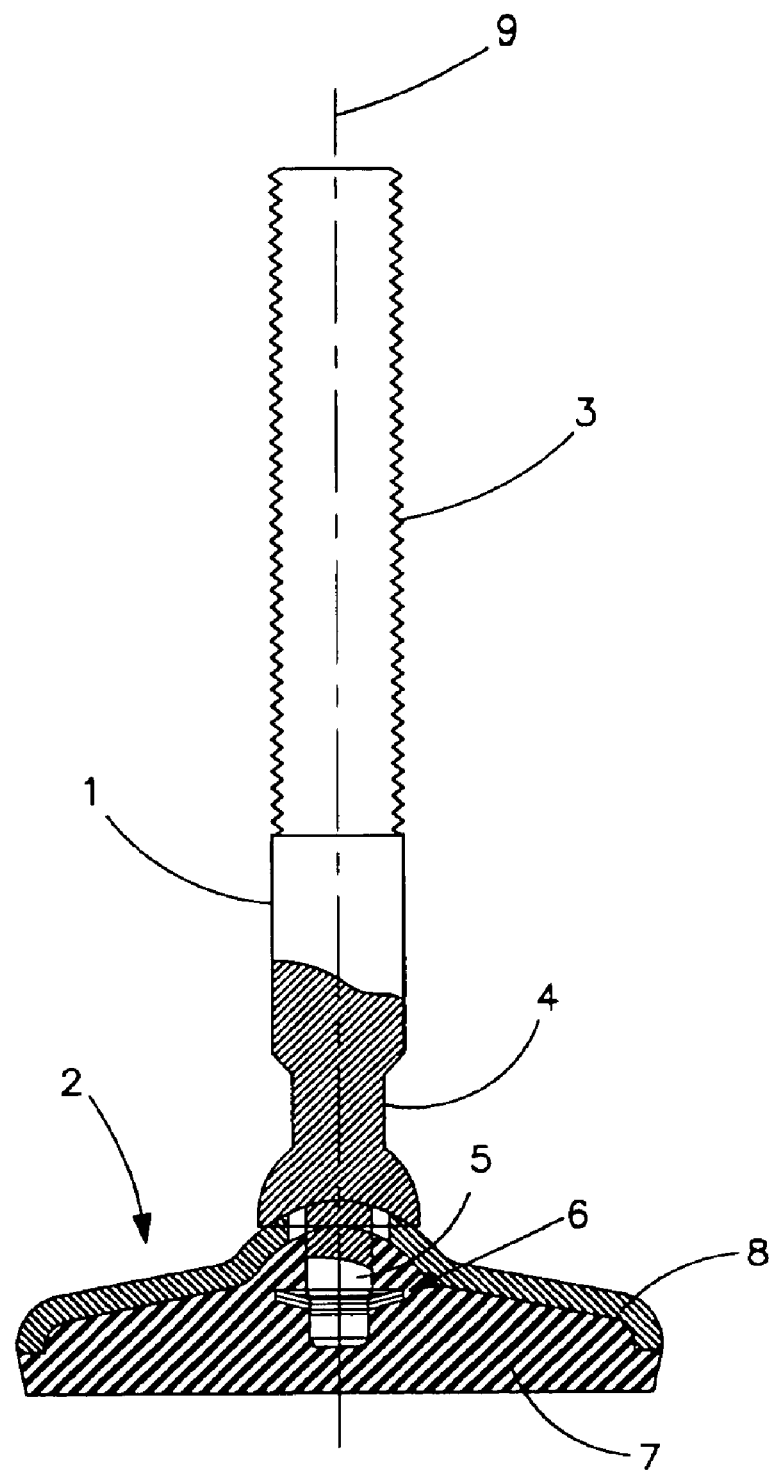
FIG. 1 is a cross-sectional view of a support where the spindle is arranged vertically relative to the lower base.

FIG. 1 shows a cross-section of a support where a spindle 1 extends from a base 2. The support is shown in section through an axis of symmetry 9. The spindle 1 is provided with threads 3 for attachment in the object which is to be supported. The spindle 1 is moreover provided with a notch in the form of a spanner face which is used for the tightening of the spindle to the object to be supported, and for level adjustment. The spindle 1 will typically be made of stainless steel.

The base 2 of the support consists of a basic material 7 which is a polymer, such as rubber, provided by a moulding, gluing or vulcanization process with a metallic surface part 8, which will typically be made of stainless steel.

The spindle 1 is introduced into the base 2 through an opening in the top of the base 2 and attached concealed by inserting the end 5 into two locking rings 6 shown. Tests have shown that two locking rings provide a sufficient attachment force between the base 2 and the spindle 1, while the extent of the diameter of the locking rings 6 is minimized, thereby allowing the top of the base 2 to be shaped as a part of a ball face having a minimal ball diameter.

FIG. 1 moreover shows that in the contact face contacting the top of the base 2 the spindle 1 is configured complementarily with the ball surface of the base, so that spindle and base are adapted completely to each other, which counteracts reception of impurities between the two support components. As will also appear from FIG. 1, the spindle 1 is made of an uninterrupted piece of material, so that no impurities can accumulate through joints or the like.

Figure 2:
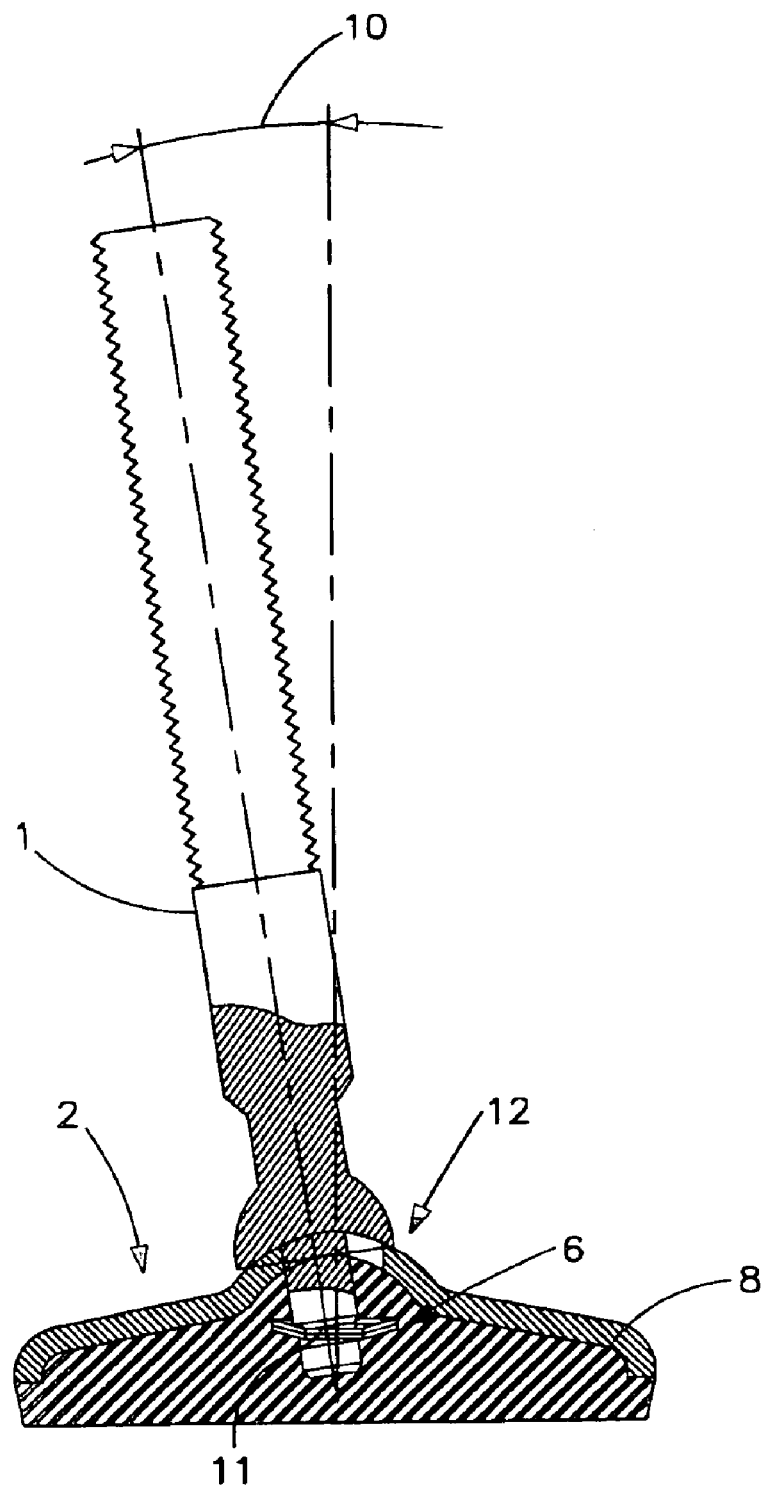
FIG. 2 is a cross sectional view of a support where the spindle has been pivoted relative to the lower base.

FIG. 2 shows a support in the same section as FIG. 1, where the spindle 1 is pivoted through an angle 10 relative to the base 2. Pivoting of the spindle takes place with the centre at point 11, which is also the centre point of the two locking rings 6.

In FIG. 2, the spindle 1 has been pivoted to an outer angle limited by the opening in the base 2. It moreover appears from FIG. 2 that the spindle 1 is configured such that it covers the opening in the top of the base 2 also at the extreme points for its movement. This means that the spindle 1 can be moved freely in all directions within the given boundaries without any possibility of penetration and accumulation of impurities in the structure.

Figure 3:
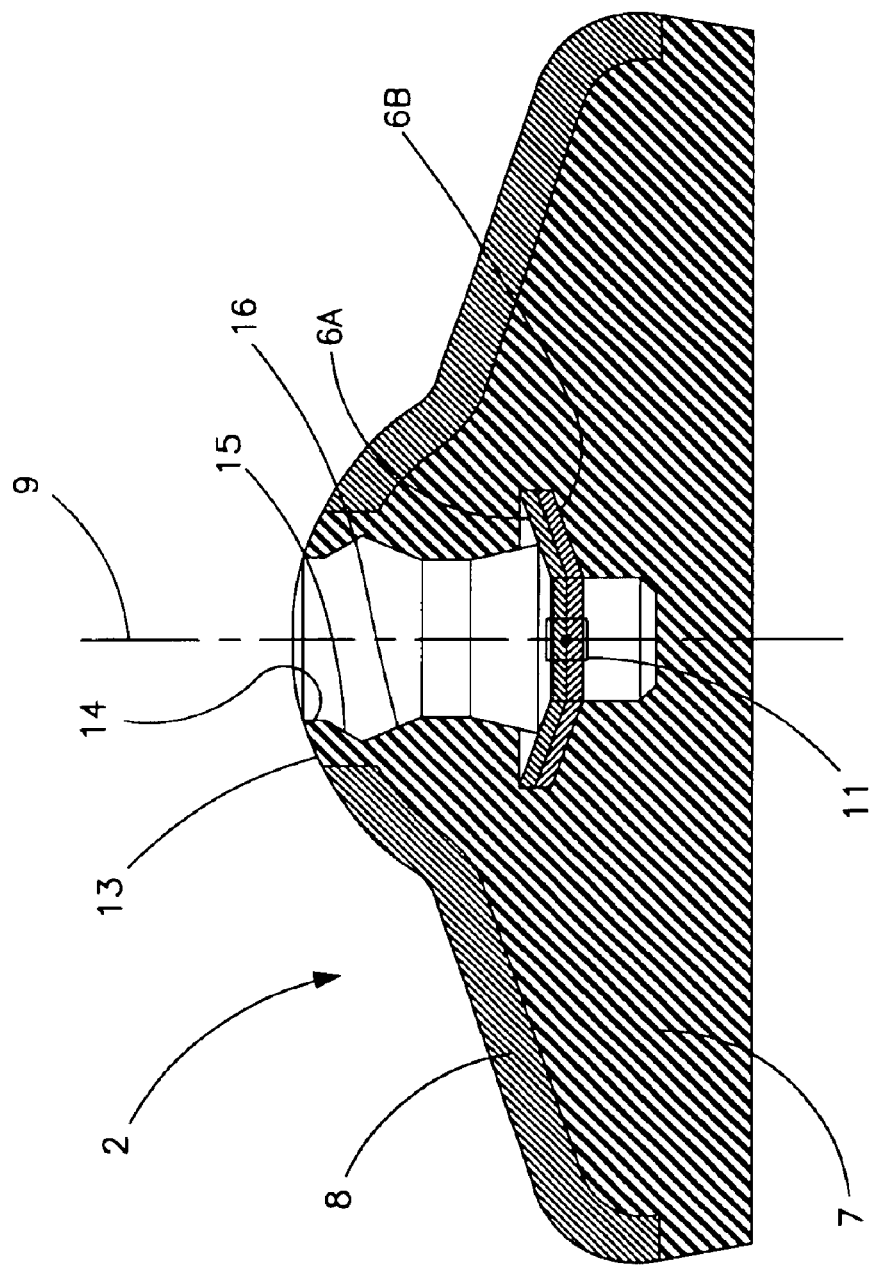
FIG. 3 is a cross sectional view of a support where two locking rings are integrated in the polymer part of the base, and illustrates that the top of the base is a part of a ball face.

FIG. 3 shows the base 2 of the support in a section through the axis of symmetry 9. The base consists of the shown basic material 7, which is a polymer e.g. a rubber mixture having an opening at the top through which a spindle may be inserted into and be attached in the integrated locking rings 6A and 6B of the polymer material. The locking rings will normally be embedded in the polymer material.

The point 11, which is the centre point for the two shown locking rings 6A and 6B, is also the centre for the movement of a spindle which is attached by insertion into the locking rings.

The upper part of the base 2 is provided with a metallic surface part 8, which is typically a stainless steel alloy, as well as a polymer part 13 which terminates in an opening for the mounting of a spindle.

As shown in FIG. 3, the opening at the top consists of a cylindrical part 14, which is characterized by having a smaller diameter than the diameter of the spindle, which is surrounded by the polymer part face 14 after insertion. When the diameter of the polymer is smaller than the diameter of the spindle, it is ensured that the junction between the polymer and the spindle is very tight, which is important when requirements are made with respect to hygiene.

It moreover appears from FIG. 3 that the opening in the polymer 7 from the cylindrical portion 14 in a direction toward the locking rings 6A and 6B changes its shape so that the diameter increases over a portion 15 and then again changes its direction so that the inner diameter of the opening again diminishes over a portion 16. When a spindle is inserted into the opening in the polymer and is attached in the locking rings 6A and 6B, the shape of the polymer shown in FIG. 3 at the subportions indicated at 15 and 16 will provide a cavity between the attached spindle and the polymer 7, as the spindle is cylindrical in the area around the faces 15 and 16.

The cavity between the polymer and the spindle caused by the faces 15 and 16 serves the function of allowing an attached spindle to move without compressing and thereby potentially damaging the polymer 7.

The configuration of the faces 15 and 16 also means that a spindle attached in the locking rings may be moved, while maintaining the sealing of the face 14 against the spindle, as the cavity below the face 14 ensures that no polymer material is pressed up from below by the spindle movement, which might result in an opening between spindle and polymer, involving the risk of penetration of impurities.

Figure 4:
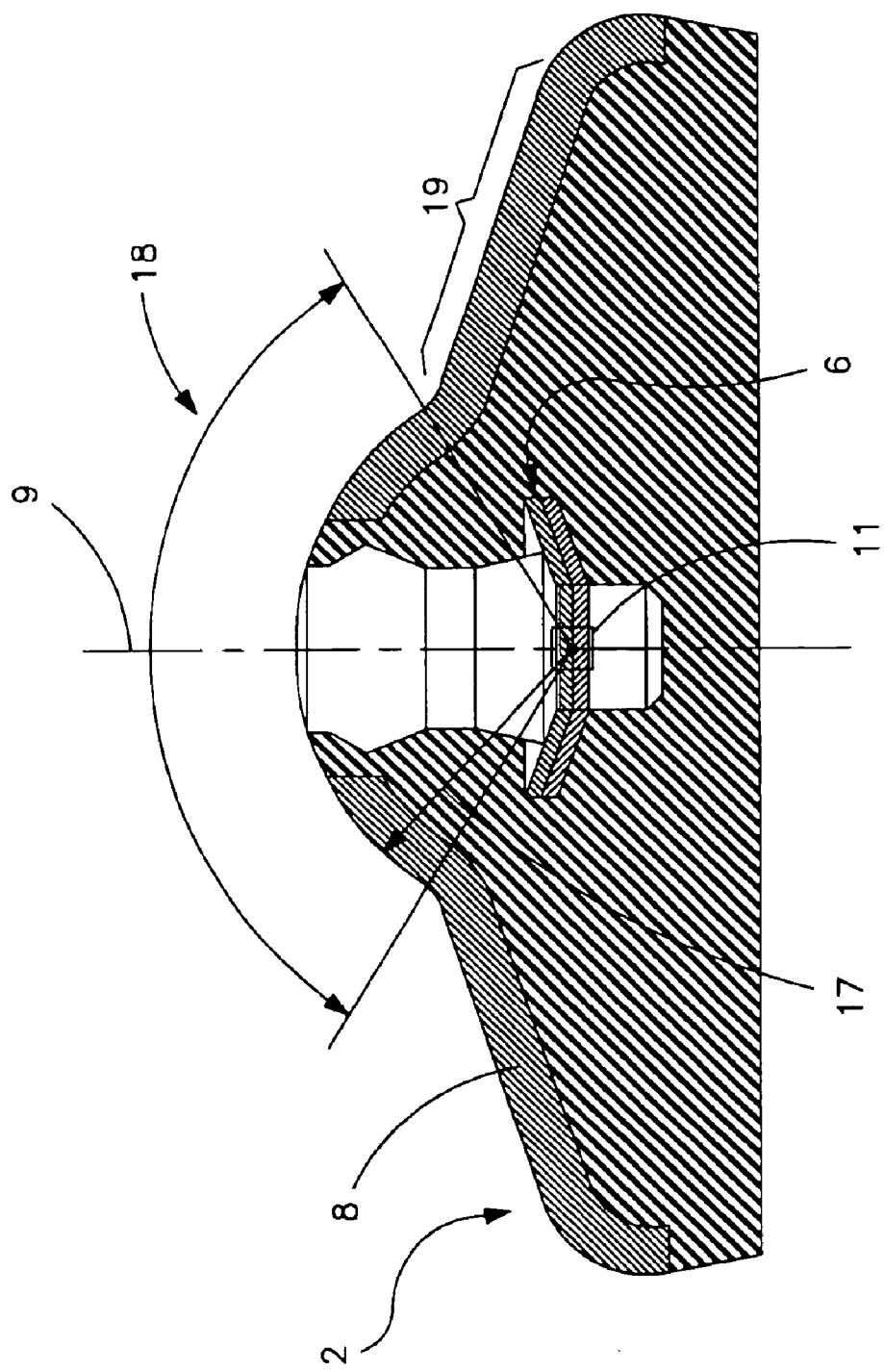
FIG. 4 shows the same cross-section as FIG. 3, but with the solid angle boundary of the ball face drawn.

FIG. 4 shows the base of a support in a section in the axis of symmetry 9, where the ball-shaped part of the top of the base is indicated at an angle 18. The ball segment has its centre at the point 11, which is also the centre point for the two locking rings 6. The radius of the ball surface is shown at 17.

The use of the two locking rings 6 provides an attachment force for a spindle inserted into the locking rings which corresponds to the force that could be achieved with just one locking ring with a larger diameter.

However, the problem is that if the locking ring diameter is increased, this would require that also the ball surface radius is to be increased, as tests have shown that a certain amount of polymer material must be present between the locking rings 6 and the metallic surface part 8 for the object to be manufactured and operate expediently.

In this connection, it is evident that increased requirements with respect to the radius of the ball face means that the support becomes physically larger, which is undesirable for several reasons, including considerations of space, and a larger machine shoe will also require a greater consumption of material, which will make the machine shoe more expensive to manufacture and thereby less competitive.

Precisely two locking rings have been found to give an optimum relation between easy production, functionality and size of the machine shoe.

In practice, expedient embodiments of the ball segment surface of the support may have a solid angle which, with the centre at 11, will have a mean value of about 4.5 steradians with outer limit values that will be in the range between 2.5 and 6.0 steradians.

As will moreover appear from FIG. 4, it is characteristic of the base part 2 of the support that the metallic surface part, forming at the top of the base a part of a ball face as indicated at the angle 18 where the ball face shape terminates, convexly changes its shape so that the metallic surface in a portion 19 forms part of a truncated cone having the smallest radius at the ball face part and the largest radius toward the bottom of the base.

It is essential in this connection that the surface, as shown at 19, is inclined from the centre of the base toward the rim of the base, whereby impurities will slide off the face, which in turn is important in terms of hygiene.

Although the invention has been explained in connection with a support for e.g. machines and a method for support, nothing prevents the principles of the invention from being used in other connections within the scope defined by the claims.

What is claimed is:

1. A machine shoe for the support of objects comprising:
   a base formed of a lower part made of a polymer material and an upper part made of metal, said base providing an upper surface shaped as part of a ball face and containing two locking rings embedded in the lower part, and
   a movable spindle which includes a lower end that extends through said upper part of said base and through said two locking rings in said lower part for attachment to said base.

2. A machine shoe according to claim 1, wherein the locking rings integrated in the base are positioned in parallel and with the same center axis, so that a centre point between centre holes of the locking rings coincides with a centre of the movement of a spindle which is held by the locking rings.

3. A machine shoe according to claim 1, wherein the ball face part of the base has its centre at the centre point between centre holes of the integrated locking rings.

4. A machine shoe according to claim 3, wherein the ball face part of the base is defined by a solid angle with the centre at the centre point between the holes of the locking rings of more than 2.5 steradians and less than 6.0 steradians and additionally defined by a steradian value of between 4.0 and 5.0.

5. A machine shoe according to claim 1, wherein a surface of the base from the ball face part changes its shape to a truncated cone with smallest radius near the ball face part and largest radius farthest from a spindle which extends from the base.

6. A machine shoe according to claim 1, wherein the base has only one opening which is arranged at the top of the ball shape, said opening being defined by polymer material, said opening being circular with a diameter which is smaller than the diameter of the spindle which is attached to the base by insertion through the opening, measured in a complementary section.

7. A machine shoe according to claim 6, wherein the opening in the polymer material at the top of the ball face of the base from the entry hole toward the bottom face of the base on the first portion is cylindrical, and then the diameter increases over a portion, following which the diameter again diminishes over the next portion.

8. A method an object comprising providing a machine shoe as defined in claim 1, and positioning said object on said machine shoe.

* * * * *